(12) United States Patent
Fattinger et al.

(10) Patent No.: US 7,825,747 B2
(45) Date of Patent: Nov. 2, 2010

(54) THIN-FILM BAW FILTER, AND A METHOD FOR PRODUCTION OF A THIN-FILM BAW FILTER

(75) Inventors: Gernot Fattinger, München (DE); Jyrki Kaitila, Helsinki (FI)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 460 days.

(21) Appl. No.: 11/272,544

(22) Filed: Nov. 10, 2005

(65) Prior Publication Data

US 2006/0119453 A1   Jun. 8, 2006

(30) Foreign Application Priority Data

Nov. 12, 2004   (DE) ................. 10 2004 054 895

(51) Int. Cl.
*H03H 9/58* (2006.01)
(52) U.S. Cl. ............................. 333/187; 333/189
(58) Field of Classification Search .............. 333/187, 333/189
See application file for complete search history.

(56) References Cited

U.S. PATENT DOCUMENTS

| | | | |
|---|---|---|---|
| 1,959,429 A * | 5/1934 | Hovgaard .................. 333/189 |
| 5,587,620 A | 12/1996 | Ruby et al. |
| 6,339,276 B1 * | 1/2002 | Barber et al. ............... 310/312 |
| 6,496,085 B2 * | 12/2002 | Ella et al. ................... 333/189 |
| 6,542,054 B2 | 4/2003 | Aigner et al. ............... 333/187 |
| 6,670,866 B2 | 12/2003 | Ellä et al. |
| 6,720,844 B1 * | 4/2004 | Lakin .......................... 333/189 |
| 6,774,746 B2 * | 8/2004 | Whatmore et al. .......... 333/189 |
| 7,019,605 B2 * | 3/2006 | Larson, III ................. 333/187 |
| 7,138,889 B2 * | 11/2006 | Lakin .......................... 333/189 |
| 2003/0227357 A1 | 12/2003 | Metzger et al. ............. 333/189 |
| 2004/0140869 A1 | 7/2004 | Marksteiner et al. ........ 333/189 |
| 2004/0145430 A1 * | 7/2004 | Metzger ..................... 333/187 |
| 2004/0212459 A1 | 10/2004 | Aigner et al. |
| 2005/0012570 A1 * | 1/2005 | Korden et al. .............. 333/189 |
| 2005/0093653 A1 * | 5/2005 | Larson, III .................. 333/187 |

FOREIGN PATENT DOCUMENTS

| | | |
|---|---|---|
| DE | 102 25 202 A1 | 12/2003 |
| DE | 102 39 317 A1 | 3/2004 |
| DE | 102 51 876 A1 | 5/2004 |
| JP | 2002217676 A * | 8/2002 |
| WO | WO 02/095085 A1 | 11/2002 |
| WO | WO 02/095939 A1 | 11/2002 |
| WO | WO 2004/021568 A1 | 3/2004 |

OTHER PUBLICATIONS

Lakin, K.M.; "Thin-Film BAW Filters for Wide Bandwidth and High Performance Applications"; IEEE MTT-S Digest; pp. 923-926, 2004.
Lakin, K.M.; "Coupled Resonator Filters"; EEEE Ultrasonics Symposium, Paper 3D-5; 8 Pgs., Oct. 2002.
Lakin, K.M.; "A Review of Thin-Film Resonator Technology"; IEEE Microwave Magazine, vol. 4, Issue 4; pp. 61-67, Dec. 2003.
Lakin, K.M.; "Thin-Film Resonator Technology"; IEEE UFFC 50th Anniversary Issue; pp. 371-381, May 1987.

* cited by examiner

*Primary Examiner*—Robert Pascal
*Assistant Examiner*—Alan Wong

(57) ABSTRACT

A thin-film BAW filter has at least one CRF section and at least one ladder or grating filter section, with the CRF section having at least two coupled resonators, with the CRF section and the ladder or grating filter section being integrated on a common substrate, in order to produce a thin-film BAW filter. In a method for production of a thin-film BAW filter, having at least one CRF section and at least one ladder or grating filter section, the CRF section has at least two coupled resonators and the CRF section and the ladder or grating filter section are integrated on a common substrate.

9 Claims, 4 Drawing Sheets

*(PRIOR ART)*

*(PRIOR ART)*

——— Series resonator  ladder section
------- Parallel resonator  ladder section
——— CRF section double resonator

_US 7,825,747 B2_

THIN-FILM BAW FILTER, AND A METHOD FOR PRODUCTION OF A THIN-FILM BAW FILTER

CROSS-REFERENCE TO RELATED APPLICATIONS

This application claims priority from German Patent Application No. 10 2004 054 895.1, which was filed on Nov. 12, 2004, and is incorporated herein by reference in its entirety.

TECHNICAL FIELD

The present invention relates to thin-film BAW filters (BAW=Bulk Acoustic Wave) and to a method for producing such filters.

BACKGROUND

Thin-film BAW filters are used, for example, in third-generation (3G) mobile radio technology in order to achieve a wide bandwidth with a low insertion loss at the same time.

Filters such as these are formed, for example, by CRF components (CRF=Coupled Resonator Filter). In general, a CRF component has two piezoelectric resonators, which are stacked one above the other, and a number of coupling intermediate layers in order to set the acoustic coupling to the desired filter characteristics.

CRF technology allows the required bandpass characteristics (that is to say the bandwidth and the insertion loss) to be achieved for all mobile radio bands. The cut-off areas, which are well away from the pass areas, have a very high insertion loss, which is governed to a significant extent by parasitic effects and by the finite conductivity of the substrate, as well as any asymmetric capacitances with respect to the substrate. However, the cut-off band values close to the pass area—the so-called transitional areas—are not optimum. In general, the mobile radio transmission and reception bands are separated from one another by transitional bands with a width of only 10 to 20 MHz, in which the filter characteristics including an insertion loss of typically better than 4 dB must change to better than 30 dB cut-off bands.

This disadvantage in the transitional bands between −5 dB and −30 dB is a fundamental characteristic of the CRF component itself and can also scarcely be improved by component design without accepting deterioration in the pass band characteristics.

One possible approach in order to obtain transitional bands with better characteristics would be to connect a CRF component to a conventional ladder filter device in the form of a cascade, as is illustrated by way of example in FIG. 8. FIG. 3 illustrates the transfer function of a ladder filter component, which has two pronounced minima associated with the series resonance of the parallel resonators and the parallel resonance of the series resonators in the ladder filter component. The illustrated example is a single T section. The layer stack which is used here is the same as that in the arrangement shown in FIG. 1, but is modified by removal of the upper electrode of the lower resonator and by its replacement by silicon dioxide. The width of the transitional bands is approximately 10 MHz for the left-hand transitional band, and 5 MHz for the right-hand transitional band, between −5 dB and −30 dB. Q factors of 1000 were used for the resonators.

FIG. 4 shows a typical layer stack of a conventional resonator which is used for ladder filters. If a single ladder filter is coupled in a cascaded form to the unbalanced port of the CRF, this results in a transfer function as shown in FIG. 5. In this case, the port can be operated as an input or output. A similar effect is achieved by using two ladder filters at the balanced outputs of the CRF. This combined CRF ladder filter has much better transitional band characteristics than a CRF on its own. Definitions of these terms can be found in the following publications and in the literature references cited in them:

G. G. Fattinger, R. Aigner, W. Nessler, "Coupled Bulk Acoustic Wave Resonator Filter: Key Technology for single-to-balanced RF Filters." Proceedings IEEE 2004 MTTS Symposium Digest.

G. G. Fattinger, J. Kaitila, W. Nessler, and R. Aigner, "Single-to-Balanced Filters for Mobile Phones using Coupled Resonator BAW Technology", IEEE UFFC Symposium 2004 Proceedings, K. M. Lakin, "A Review of Thin-Film Technology", IEEE Microwave Magazine, December 2003, p. 61.

K. M. Lakin, "Thin Film Resonator Technology", IEEE UFFC 50th Anniversary Issue.

K. M. Lakin, "Coupled Resonator Filters", IEEE 2002 Ultrasonics Symposium Proceedings.

SUMMARY

One object of the present invention is to provide a filter which occupies less space but has the transfer characteristics that are required for mobile radios, and to provide a simple method for its production.

This object can be achieved by a thin-film BAW filter, comprising at least one CRF section and at least one ladder or grating filter section, with the CRF section having at least two coupled resonators, wherein the CRF section and the ladder or grating filter section are integrated on a common substrate.

At least a portion of the filter can be in the form of a ladder or grating filter section, and another portion can be in the form of a CRF section. At least one electrode of the lower resonator in the ladder filter section can be replaced by a planarization layer. The upper electrode of the lower resonator in the ladder filter section can be replaced by a planarization layer. The lower electrode of the lower resonator in the ladder filter section can be replaced by a planarization layer.

The planarization layer may comprise a semiconductor oxide, a semiconductor nitride or a dielectric. One or more detuning layers can be provided in the ladder or grating filter section.

The object can also be achieved by a method for production of a thin-film BAW filter, comprising the steps of providing at least one CRF section, providing at least one ladder or grating filter section, with the CRF section having at least two coupled resonators, and integrating the CRF section and the ladder or grating filter section on a common substrate.

At least a portion of the entire filter can be in the form of a ladder or grating filter section. One electrode of the lower resonator can be replaced by a planarization layer. The upper electrode of the lower resonator can be replaced by a planarization layer. The lower electrode of the lower resonator can be replaced by a planarization layer. A semiconductor oxide, a semiconductor nitride or a dielectric can be applied as the planarization layer. A detuning layer can be applied in the ladder or grating filter section. Frequency trimming steps can be provided.

The invention accordingly provides a thin-film BAW filter having at least one CRF section and at least one ladder or grating filter section, with the CRF section having at least two coupled resonators, and with the CRF section and the ladder or grating filter section being integrated on a common substrate.

The method according to the invention for production of a thin-film BAW filter comprises, in a corresponding manner, the integration of the CRF section and of the ladder or grating filter section on a common substrate.

The integration of the CRF and of the ladder filter on a common substrate, that is to say as a monolithic arrangement, results in size, price and performance advantages.

At least one section of the overall structure is preferably in the form of a ladder or grating filter section.

At least one electrode of the lower resonator in the ladder or grating filter section is replaced by a planarization layer. A component such as this can be produced easily. A design such as this can be produced particularly economically. Possible difficulties which can occur during the subsequent metallization and passivation steps are reliably avoided.

In this case, the upper electrode of the lower resonator can be replaced by a planarization layer, or the lower electrode of the lower resonator can be replaced by a planarization layer. Furthermore, both electrodes of the lower resonator can also be replaced by a planarization layer.

One particular advantage of the design in this case is that no additional masks and/or method steps are required.

The planarization layer is preferably a semiconductor oxide or a semiconductor nitride, for example based on silicon. Alternatively, any other desired dielectrics can also be used.

In one advantageous embodiment of the invention, a detune layer is provided in the ladder or grating filter section in order to reduce the frequency of the parallel resonators.

In yet another embodiment, frequency trimming steps are provided.

One particular advantage is that a monolithic CRF ladder filter such as this can be produced with only a single additional deposit step and with only two to three additional masks. The process described in EP-A-1219028 can be used as the basic production process.

Further layers may be used in the ladder filter. For example, the lower coupling oxide layer can be replaced on the ladder section resonator by tungsten, in order to finely tune the characteristics of the individual resonator.

According to one idea on which the invention is based, "normal" individual resonators are produced within an existing CRF process, and can be used for integration of a ladder or grating section.

The omission of one electrode of the lower resonator means that this electrode is simply not drawn at all in the lithographic mask. Nothing need be changed in the processing at this point, in comparison to the normal CRF process. The planarization dielectric is applied in any case.

Previous approaches for integration of individual resonators always include the assumption that one of the two resonators would have to be completely removed (by subsequent etching, or the like). This is not necessary in this case.

BRIEF DESCRIPTION OF THE DRAWINGS

The invention will be described in more detail with reference to one exemplary embodiment in the drawing, in which.

DETAILED DESCRIPTION

Figure 1:
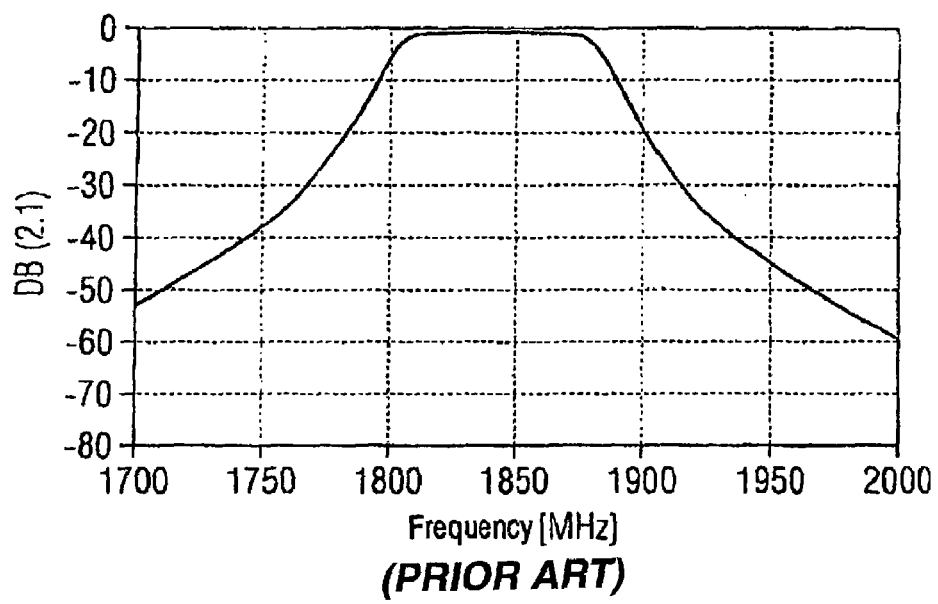
FIG. 1 shows the transfer function of a CRF.

FIG. 1 shows the calculated transfer function for a CRF component as is known from the prior art with two sections for a GSM band which is centered on 1842.5 MHz. The cut-off of the transitional bands illustrated there is about 30 MHz between −5 dB and −30 dB.

Figure 2:
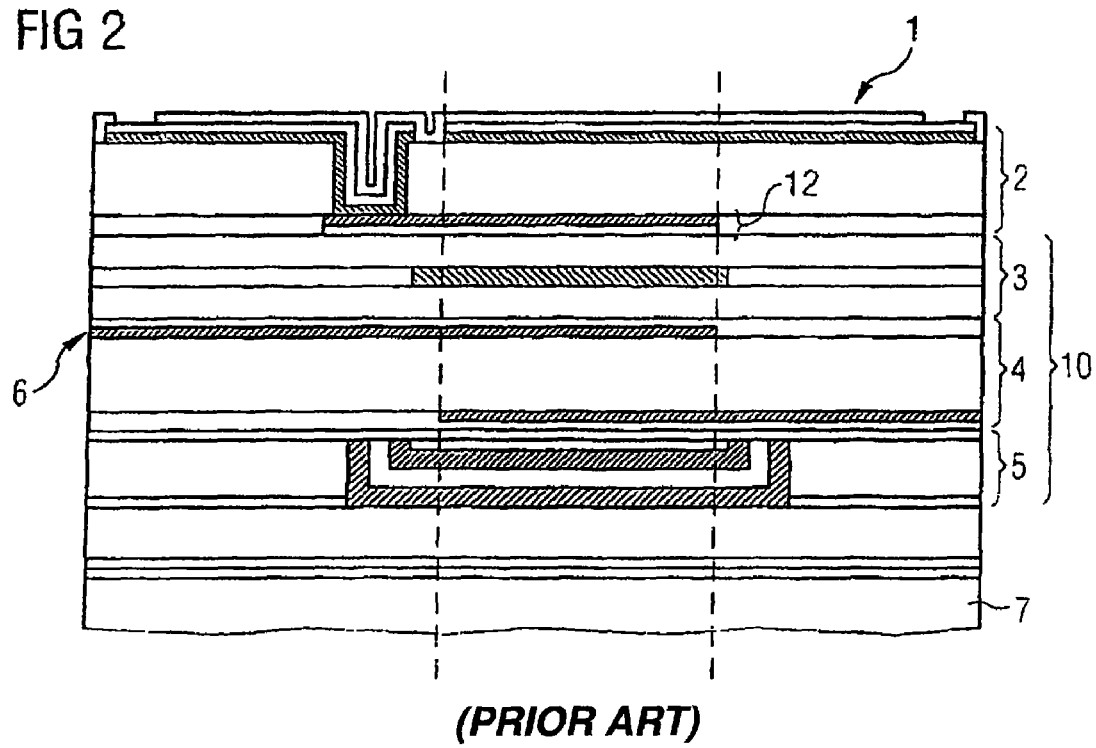
FIG. 2 shows the design of a CRF resonator stack.

FIG. 2 shows the design of a typical CRF resonator stack 1, as is likewise known from the prior art. The active area of the resonator stack is bounded by the dashed lines and typically has a width of about 50 μm to about 300 μm. The layer stack comprises an upper resonator 2 with piezoelectric layers, for example composed of aluminum nitride (AlN) or ZnO. Furthermore, the upper resonator 2 comprises two electrodes 11, 12, which, for example, can be formed from a plurality of metallic and dielectric layers. In one exemplary embodiment, which is not shown here, only a single layer is provided for each electrode, rather than two layers for each electrode.

Coupling layers 3, which, inter alia, for example, may have a layer with high acoustic impedance, are located between the upper resonator 2 and the lower resonator 4, which is designed in the same way as the upper resonator 2 in the present exemplary embodiment. An acoustic mirror 5 is arranged underneath the lower resonator 4. Furthermore, the reference symbol 6 denotes a connecting point between the resonator and similar sections or components. The layer stack is applied to a substrate 7. The two resonators are also constructed differently in an exemplary embodiment which is not shown here.

Figure 3:
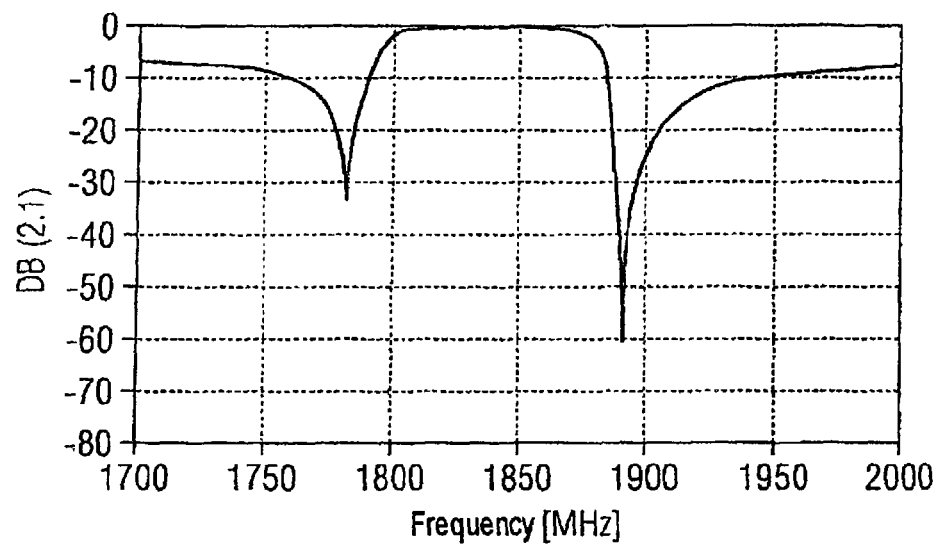
FIG. 3 shows the transfer function of a T section of a ladder filter.

FIG. 3 shows the transfer function of a single T section of a ladder filter. The layer stack which is used is the same as that which was used in FIG. 1, but has been modified by removing the upper electrode of the lower resonator and by replacing it by planarization silicon dioxide. As already mentioned in the introduction to the description, the cut-offs are approximately 10 MHz for the left-hand transitional band and 5 MHz for the right-hand transitional band.

Figure 4:
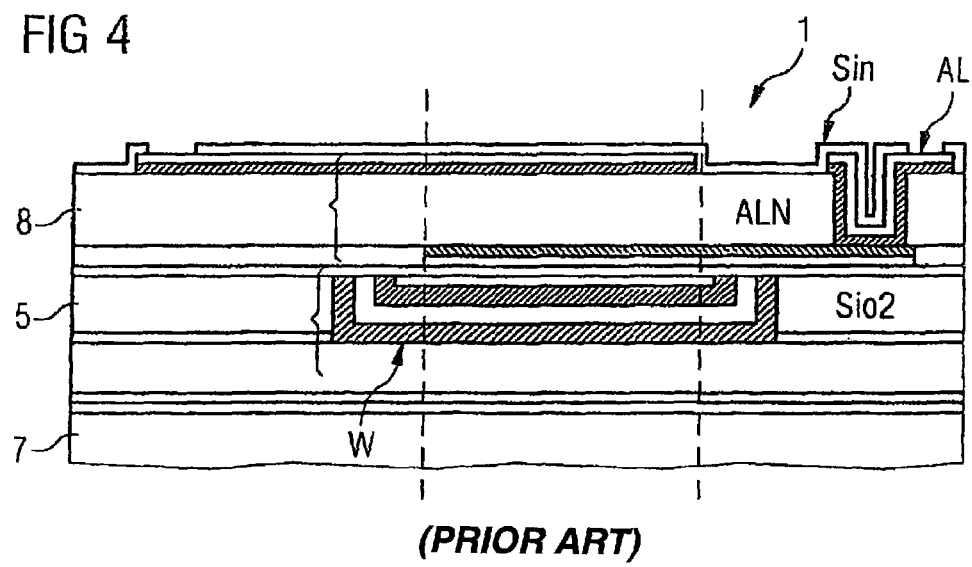
FIG. 4 shows the design of a conventional BAW resonator.

FIG. 4 shows a further design of a BAW resonator whose active area is 100 to 300 μm (identified by the dashed lines). The resonator stack 1 has only one resonator 8 with an electrode. A layer stack of the acoustic mirror 5 is arranged underneath this, and is in turn deposited on the substrate 7.

Figure 5:
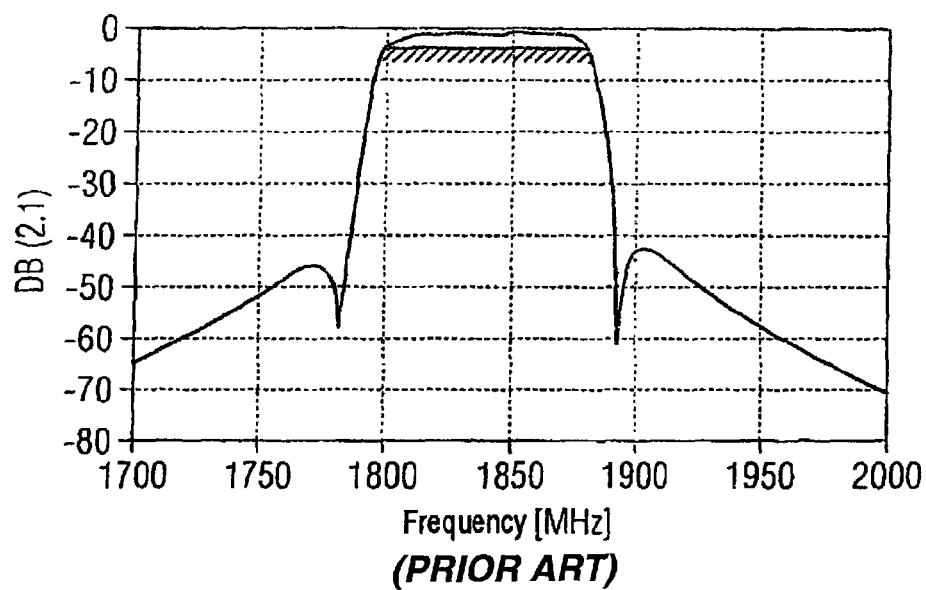
FIG. 5 shows the transfer function of a cascade comprising a T section of a ladder filter and a two-stage CRF.

The transfer function of a combined filter whose ladder filter is coupled in a cascaded manner to the unbalanced output of the CRF is illustrated in FIG. 5. The cut-offs are approximately 10 MHz for both transitional bands.

Figure 6:
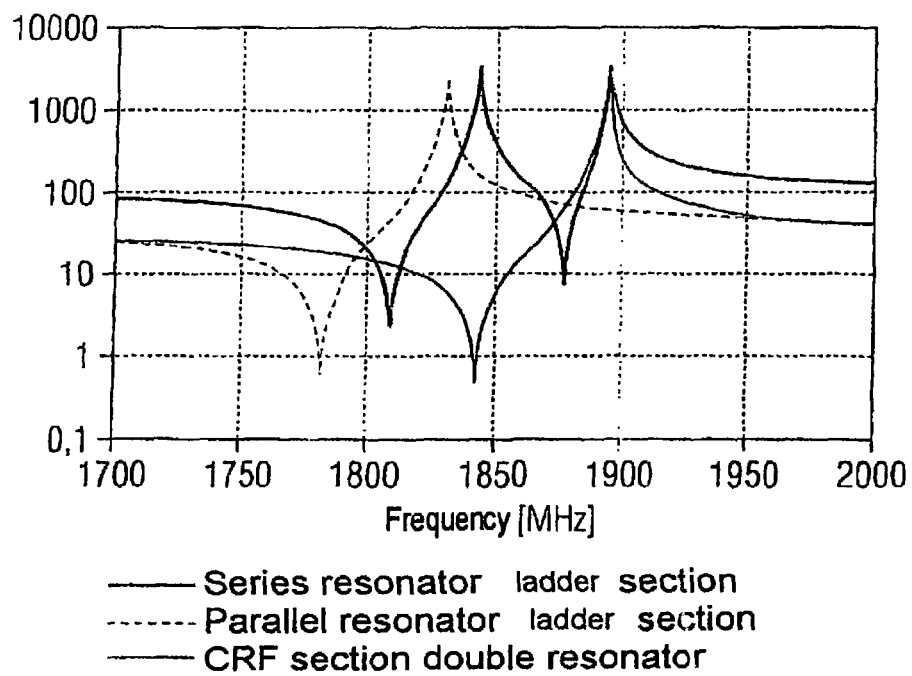
FIG. 6 shows the impedance of the resonators in a CRF layer stack, and of a stack as shown in FIG. 7, with and without an additional detune layer.

FIG. 6 shows, inter alia, calculated characteristics of the upper resonator in the situation where the upper electrode of the lower resonator of the ladder filter section has been removed and has been replaced by the planarization oxide. Furthermore, the illustration shows the situation described here with an additional detune layer. In addition, the figure shows the resonator impedance characteristic of the unchanged CRF layer stack during measurement of the upper resonator and open electrodes of the lower resonator of the ladder filter section. A layer stack according to the invention such as this is illustrated in FIG. 7.

Figure 7:
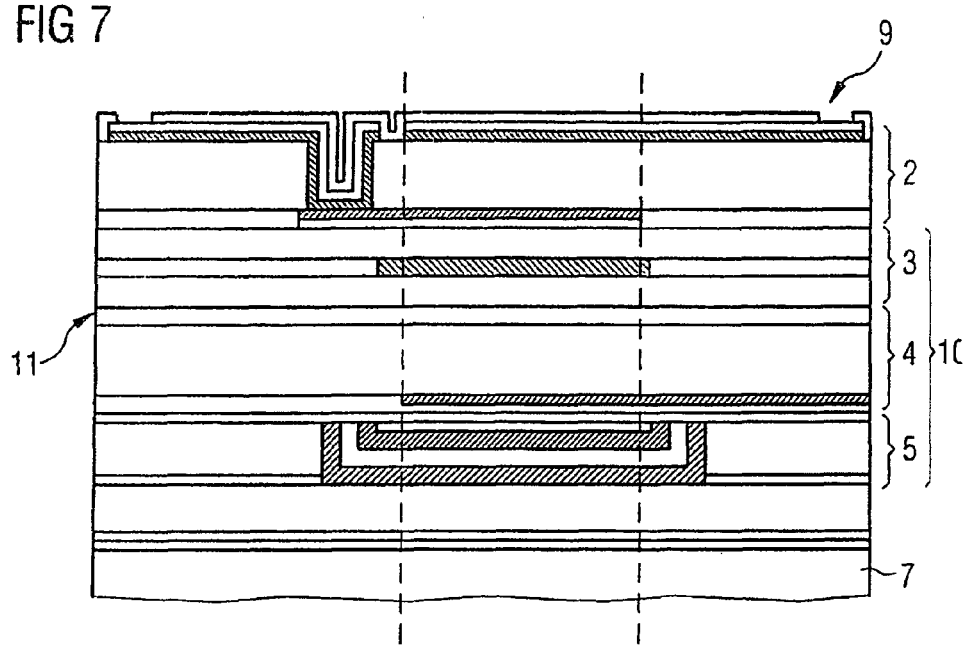
FIG. 7 shows the layer stack during removal and planarization of the upper electrode of the lower resonator.

FIG. 7 shows the layer stack according to the invention of the combined monolithic CRF ladder resonator 9 after removal and planarization of the upper electrode of the lower resonator 4. The reference symbol 11 denotes the layer of the previous electrode of the lower resonator 4, which has been replaced. The layer stack comprises an upper resonator 2, the original coupling layers 3, the original lower resonator 4 and the original mirror 5 on a substrate 7. The reference symbol 10 denotes the layers which form the new mirror, which was formed from the existing layers.

The thin-film BAW filter component according to the invention that has just been described can be manufactured using, as the basic process, a production process based on the BAW process at Infineon Technologies AG (EP-A-1219028).

This Infineon BAW process is based on the planarization of the mirror and of the lower electrode stack before the piezoelectric deposition process. This is therefore carried out in this way, inter alia, in order to obtain a reliable piezo layer result with a high-quality AlN film. This in turn directly influences the piezoelectric coupling coefficients ($k_{eff}$), that is to say the filter bandwidth and Q factors. For the same reasons, the upper electrode of the lower resonator, the coupling layers between the two resonators and the lower electrode of the upper resonator are planarized in the CRF method according to the invention. The resonators which are produced using the method according to the invention have coupling coefficients of approximately 6.6%.

Finally, in order to produce the ladder section, the frequency of the parallel resonators must also be reduced with respect to the series resonators. A detune layer is thus additionally required, as is normally used in a conventional ladder filter production method. Furthermore, frequency tuning steps are required (for example described in EP-A-1390559). Overall, this means that it is thus possible to produce the monolithic CRF ladder filter according to the invention.

The removal of either one or both electrodes of the lower resonator shifts the resonance frequency which is associated with this resonator well away from the resonance of the upper resonator. This results in good purity of the main resonance, while at the same time significantly attenuating the other resonance. The same method as that described above can also be used to produce a combined CRF grating filter.

Furthermore, the present method can be further refined by the provision of further layers in the ladder filter.

Figure 8:
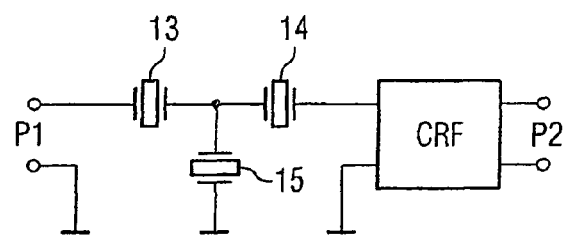
FIG. 8 shows a circuit diagram of a T element, which is connected in the form of a cascade to a CRF component.

FIG. 8 shows one option for series connection of a T element of a ladder filter and of a CRF filter, which is produced very easily from a single substrate by means of the invention.

An input/output P1 is in this case in a "single-ended" form, that is to say a single signal line with a ground reference. A port P2 is designed with a so-called "balanced" configuration, that is to say this comprises two signal lines which are phase-shifted through 180° with respect to one another. The reference ground for the output P2 need not be related to the reference ground for the input 1 (potential isolation).

In addition, the reference impedance in the CRF section can also be changed, for example the CRF input can form a 50 ohm termination, while in contrast the CRF output is 200 ohms. Both characteristics, impedance and mode conversion, cannot be achieved by ladder or grating filters on their own. It would thus also not be possible to achieve such a high degree of stop band suppression well away from the pass band.

In contrast, a CRF on its own would not allow such steep filter flanks or such good stop band suppression in the area close to the pass band.

This arrangement thus acts as a balancing element, in which an unbalanced port P1 is transformed to a balanced port P2, or vice versa.

One special feature in this case is that one or all of the resonators 13, 14 or 15 are designed in accordance with the invention, for example as shown in FIG. 7. The CRF section is designed, for example, as shown in FIG. 2. The basic arrangement of these components on a single substrate is obtained by placing the two figures alongside one another. The electrical connections can be seen in the circuit diagram in FIG. 8.

LIST OF REFERENCE SYMBOLS

1 CRF resonator stack
2 Upper resonator
3 Coupling layers
4 Lower resonator
5 Mirror
6 Connecting point
7 Substrate
8 Resonator
9 Combined CRF ladder resonator
10 New mirror
11 First electrode
12 Second electrode
13 Series resonator
14 Series resonator
15 Shunt resonator (or parallel resonator)

What is claimed is:

1. A thin-film BAW filter, comprising:
   at least one coupled resonator filter (CRF) section having at least one resonator pair, each resonator pair comprising two coupled resonators stacked one above the other,
   at least one ladder or grating filter section, with at least one pair of further coupled resonators, each further coupled resonator pair comprising an upper resonator and a lower resonator, the CRF section and the ladder or grating filter section being integrated on a common substrate adjacent one another, wherein a dielectric planarization layer is disposed between each of upper and lower resonators of the further coupled resonators instead of an electrode of the lower resonator.

2. A filter according to claim 1, wherein the dielectric planarization layer comprises a semiconductor oxide, or a semiconductor nitride.

3. A filter according to claim 1, further comprising: one or more detuning layers is or are provided in the ladder or grating filter section.

4. A method for production of a thin-film BAW filter, the method comprising:
   providing at least one coupled resonator filter (CRF) section having at least one resonator pair, each resonator pair comprising two coupled resonator stack one above the other CRF section,
   providing at least one ladder or grating filter section with at least one pair of further coupled resonators, each further coupled resonator pair comprising an upper resonator and a lower resonator, the providing the at least one ladder or grating filter section further comprises forming electrodes on the lower resonator, integrating the CRF section and the ladder or grating filter section on a common substrate adjacent one another, and forming a dielectric planarization layer instead of at least one of the electrodes of the lower resonator.

5. A method according to claim 4, wherein the dielectric planarization layer comprises a semiconductor oxide, or a semiconductor nitride.

6. A method according to claim 4, wherein a detuning layer is applied in the ladder or grating filter section.

7. A method according to claim 4, wherein frequency trimming steps are provided.

8. A thin-film bulk acoustic wave (BAW) filter, comprising:
at least one coupled resonator filter (CRF) section having at least one resonator pair, each resonator pair comprising two coupled resonators stacked one above the other,
at least one ladder or grating filter section, with at least one pair of further coupled resonators, each further coupled resonator pair comprising an upper resonator and a lower resonator, the CRF section and the ladder or grating filter section being integrated on a common substrate adjacent one another,
a dielectric planarization layer disposed between each of the upper and lower resonators of the further coupled resonators and instead of an electrode of the lower resonator, and
one or more detuning layers in the ladder or grating filter section.

9. A filter according to claim 8, wherein the dielectric planarization layer comprises a semiconductor oxide, or a semiconductor nitride.

* * * * *